(12) United States Patent
Liu et al.

(10) Patent No.: US 10,262,994 B2
(45) Date of Patent: Apr. 16, 2019

(54) FINFET LDMOS DEVICES WITH ADDITIONAL DYNAMIC CONTROL

(71) Applicant: AVAGO TECHNOLOGIES INTERNATIONAL SALES PTE. LIMITED

(72) Inventors: Qing Liu, Irvine, CA (US); Akira Ito, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/495,236

(22) Filed: Apr. 24, 2017

(65) Prior Publication Data

US 2018/0308841 A1    Oct. 25, 2018

(51) Int. Cl.
| | |
|---|---|
| *H01L 29/66* | (2006.01) |
| *H01L 27/088* | (2006.01) |
| *H01L 29/06* | (2006.01) |
| *H01L 29/78* | (2006.01) |
| *H01L 29/16* | (2006.01) |
| *H01L 23/528* | (2006.01) |

(52) U.S. Cl.
CPC ...... *H01L 27/0886* (2013.01); *H01L 23/5283* (2013.01); *H01L 29/0649* (2013.01); *H01L 29/16* (2013.01); *H01L 29/7831* (2013.01); *H01L 29/7851* (2013.01)

(58) Field of Classification Search
CPC ............. H01L 27/0886; H01L 23/5283; H01L 29/0649; H01L 29/16; H01L 29/7831; H01L 29/7851
USPC ........................................................ 257/329
See application file for complete search history.

(56) References Cited

U.S. PATENT DOCUMENTS 9,412,871 B2 *   8/2016   Doornbos ........... H01L 29/1054

\* cited by examiner

*Primary Examiner* — Tu-Tu V Ho
(74) *Attorney, Agent, or Firm* — Xsensus, LLP (57) ABSTRACT

A FinFET semiconductor device having semiconductor body including a source region of a first type, and a drain region of a second type, and a drain-region shallow trench isolation (STI) disposed in the drain region. The device includes a plurality of fins attached to the semiconductor body and extending across the semiconductor body, a channel gate disposed over a section of the plurality of fins; a supplemental gate disposed on the drain-region STI.

18 Claims, 12 Drawing Sheets

Structure A

FIG. 4A

Structure B

In-site EPI doped fin as Source

Impact area from the dynamic control gate

FIG. 4B

Structure A

FIG. 5A

Structure B

FINFET LDMOS DEVICES WITH ADDITIONAL DYNAMIC CONTROL

BACKGROUND OF THE INVENTION

Field of Invention

The invention relates to gate control for a vertically stacked field effect transistor.

Discussion of the Background

Rapid advances in electronics and communication technologies, driven by immense customer demand, have resulted in the widespread adoption of electronic devices of every kind. The transistor is a fundamental circuit component of almost all of these devices. Transistors have a wide range of circuit applications. Laterally Diffused MOSFET (LDMOS) transistors for instance provide a key building block for radio frequency power amplifiers. An LDMOS is an asymmetric power MOSFET designed for low on-resistance and high blocking voltage.

A FinFET transistor is a field effect transistor which utilizes a channel region oriented to conduct an electrical current parallel to the surface of an underlying substrate typically including n-type and p-type well regions. The channel region is provided in an elongated section of semiconductor material referred to in the art as a "fin." The source and drain contact regions of the FinFET transistor are typically also formed in the elongated section on either side of the channel region. A gate is placed over and on both opposed sides of the elongated section at the location of the channel region to provide control over the conductive state of the transistor. The FinFET design is well suited for manufacturing a multi-channel transistor in which multiple elongated sections are formed in parallel to define neighboring channel regions separated from each other by an intermediate gate portion, where the transistor gate spans with a perpendicular orientation over the multiple elongated sections.

SUMMARY OF THE INVENTION

In one embodiment, there is provided a FinFET semiconductor device having semiconductor body including a source region of a first type, and a drain region of a second type, and a drain-region shallow trench isolation (STI) disposed in the drain region. The device includes a plurality of fins attached to the semiconductor body and extending across the semiconductor body, a channel gate disposed over a section of the plurality of fins; a supplemental gate disposed on the drain-region STI.

In another embodiment, there is provided a method for operating a FinFET having a semiconductor body, a plurality of fins attached to the semiconductor body and extending and extending across the semiconductor body; a channel gate disposed over a section of the fins, and a supplemental gate disposed on a drain-region STI, the method comprising: providing control voltages to the channel gate; and under higher power switching conditions, applying a supplemental voltage to the supplemental gate.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Reference will now be made in detail to the present preferred embodiment of the invention, an example of which is illustrated in the accompanying drawings, in which like reference characters refer to corresponding elements.

FinFET is one of the leading CMOS technologies for current and future scaling of lateral diffused MOSFETs. The FinFET is primarily designed to handle high voltage applications. There is a need to eliminate degradation problems experienced with existing designs. Work by the inventors has identified that the source of one or more problems associated with the formation of shallow trench isolations (STI) in FinFET technology. In particular, the inventors have found that less than optimized approaches for the formation of STIs have resulted in excessive defective states along STI and nearby the edge of the Fin channel. With this knowledge, the embodiments of the invention described below were discovered to alleviate or substantially remedy the degradation problems.

Figure 1:
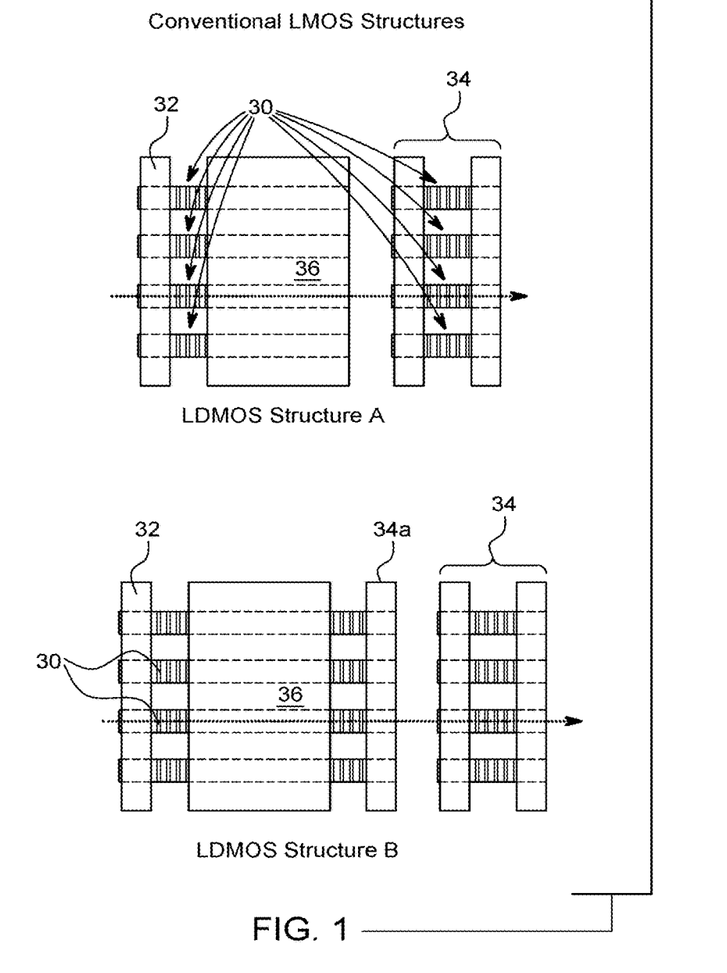
FIG. 1 is a schematic illustrating two conventional LDMOS structures.

FIG. 1 is a schematic illustrating two conventional LDMOS structures referred to as "structure A" and "structure B." The difference between structure A and structure B is that structure B contains a raised drain contact at the side of the Fin channel opposite the source. In structure A, the drain contact occurs at the side of the Fin channel opposite the source.

Figure 2:
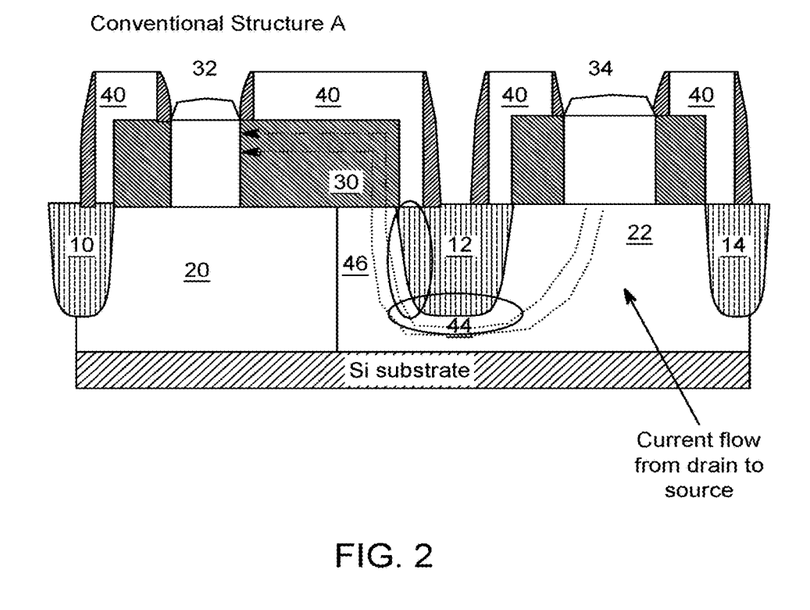
FIG. 2 is a schematic illustrating a sectional view of one of the conventional LDMOS structures of FIG. 1.

FIG. 2 is a schematic illustrating a sectional view of structure A. In this view, STIs 10, 12, and 14 are disposed with STI 14 bounding the outside of the p-well 20, STI 14 bounding the outside of n-well 22, and STT 12 disposed in the n-well 22 on a side of the n-well 22 near the Fin channel 30. The Fin channel 30 is formed to be undoped and contacts on the p-well 20 on the underside. As shown in FIG. 2, the Fin channel contacts source contact 32 and extends across the p-well 20 until it contact the region of the n-well 22 between the p-well 20 and STI 12. Drain contact 34 contacts the n-well 22 between STI 12 and STI 14. As shown, the source and drain contacts can be raised source drain contacts. An oxide 40 covers the perimeter of the source and drain contacts. Oxide 40 extends around the sides of Fin channel 30, and a gate (as shown in FIG. 1) controls conduction in the Fin channel 30.

As depicted in FIG. 2, current flows underneath STI 12 in passing from the drain contact 34 to the n-well region in contact with Fin channel 30. Defects in regions 44 and 46 impact the current flowing into the Fin channel 30.

Figure 3:
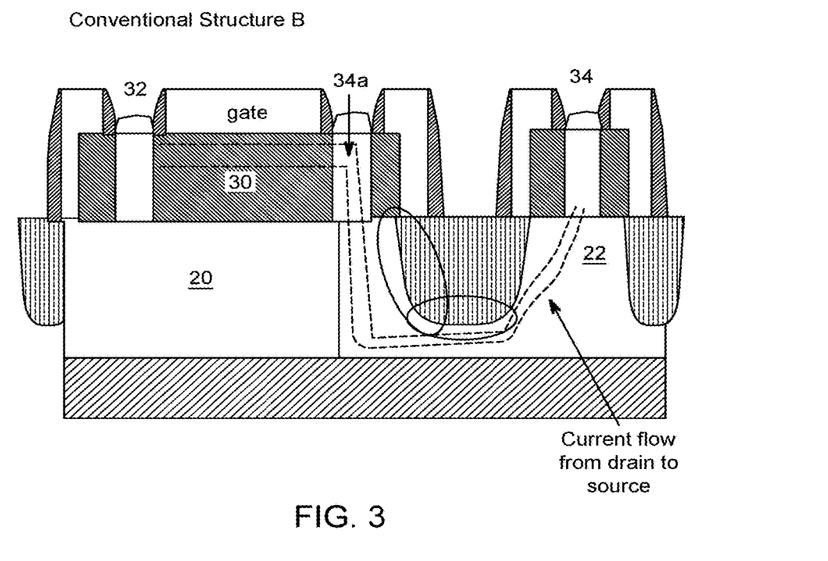
FIG. 3 is a schematic illustrating a sectional view of the other of the conventional LDMOS structures of FIG. 1.

FIG. 3 is a schematic illustrating a sectional view of structure B. In this view, the elements used are same as in FIG. 2 except for the existence of pseudo drain 34a. As depicted in FIG. 3, current flows underneath STI 12 in passing from the drain contact 34 to pseudo drain 34a formed on the n-well region 22 between p-well 20 and STI 12. As in FIG. 2, defects in regions 44 and 46 of FIG. 3 impact the current flowing into the Fin channel 30.

The proposed structures utilize the additional control gate and can gauge the current away from the defect rich regions in 44 and 46. For this reason, the inventive structures below are advantageous.

Exemplary Embodiments

Figure 4A:
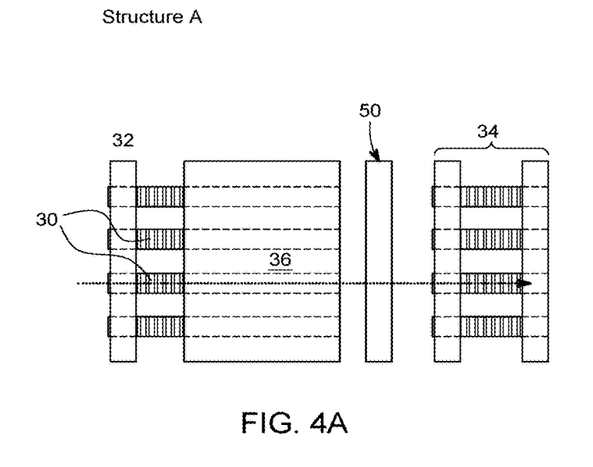
FIG. 4A is a schematic illustrating an LDMOS structure of the present invention utilizing a supplemental control gate in between the end of Fin channel and a drain contact.
Figure 4B:
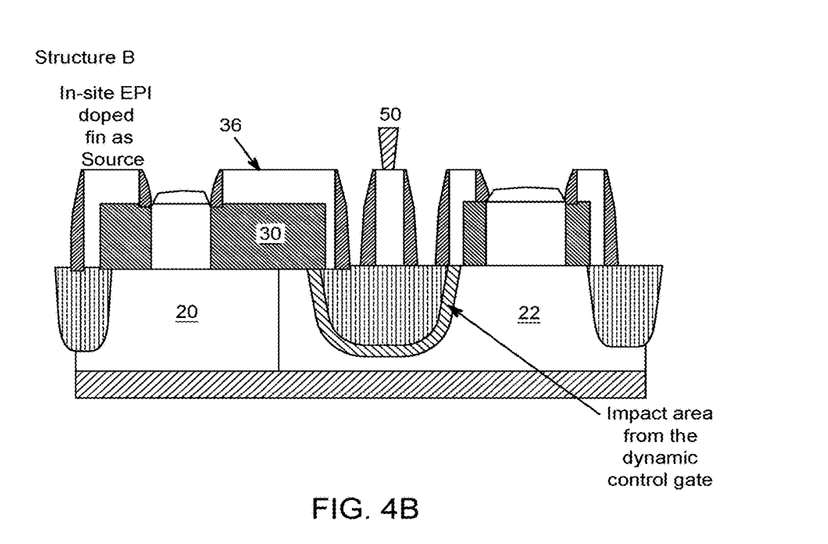
FIG. 4B is a schematic showing a cross section of the LDMOS structure shown in FIG. 4A.

FIG. 4A is a schematic illustrating an LDMOS structure of the present invention utilizing an additional control gate in between the end of Fin channel and the drain contact 34. FIG. 4B is a schematic showing a cross section of the LDMOS structure shown in FIG. 4A. In one embodiment of the present invention, a dynamic control gate 50 (referred to herein as a supplemental gate) is provided on top of STI 12. With the STI depth in state-of-the-art FinFETs being reduced to ~60 nm from the traditional 200-300 nm, supplemental gate 50 can deplete charge or accumulate charge in regions 44 and 46 under STI 12. For example, applying a voltage to gate 50 operates to bias the region of the STI around regions 44 and 46, serving to extend the operational conditions of the FINFET LDMOS. As shown in FIG. 4B, the dynamic control gate (supplemental gate 50) is sitting on top of STI 12 and controls the current flow below the STI. If the STI is too deep, the effectiveness is lowered. In current and future FinFET technologies, the STI depth is ~60 nm (40~80 nm), compared with traditional STI depth of greater than or equal 200 nm in planar technologies (28/40/65 nm, etc.). At the 60 nm depth, voltages on supplemental gate 50 can modulate the current path flowing under the STI toward the FINFET channels.

In one embodiment of the present invention, gate 50 can be floating. In one embodiment of the present invention, gate 50 can be grounded. In one embodiment of the present invention, supplemental gate 50 can be forward or reverse biased. In the floating or grounded states, supplemental gate 50 does not greatly impact the performance of the FinFET LDMOS. Meanwhile, forward biasing in an n-type NLDMOS case for example, with a positive voltage will attract the electrons toward regions 44 and 46, and reduce the on resistance of the NLDMOS, thereby enhancing the drive current, especially in the linear region Reverse biasing of the NLDMOS, with a negative voltage will repel (deplete) electrons from regions 44 and 46. Although the drive current will be slightly lower, the leakage current will also be lower. As such, the reliability improves dramatically since the current path avoids the defect rich regions 44 and 46.

Furthermore, in one embodiment of the invention, supplemental gate 50 provides a dynamic control which can provide a "boost" of current during a "turbo mode" when additional computational power is needed, and then can be switched back to a "normal mode" under other conditions. Generally speaking, the turbo mode is a computation dense operation over a short period time, such as loading a game, or handle a spike of data processing. In some integrated circuit (IC) applications, it is desirable to have a mode in which the system clock frequency can be increased by a predefined amount on a temporary basis and then returned to the original frequency (this mode is often referred to herein as a Turbo Mode). For example, a switching system might experience a temporary increase in usage such that the overall performance would be negatively impacted. If the IC could temporarily increase the frequency of its system clock, the network performance degradation might potentially be avoided. During the higher frequency operational periods, the current in the switching cycles can be a significant source of power loss. By activating supplemental gates 50 to accumulate more charge, there will be power boosting during this period of turbo operation. In sleeping mode, activating supplemental gates 50 to lower the current can further reduce the power. The switching between transistor operational modes can be controlled by foundry standard programming.

Figure 5A:
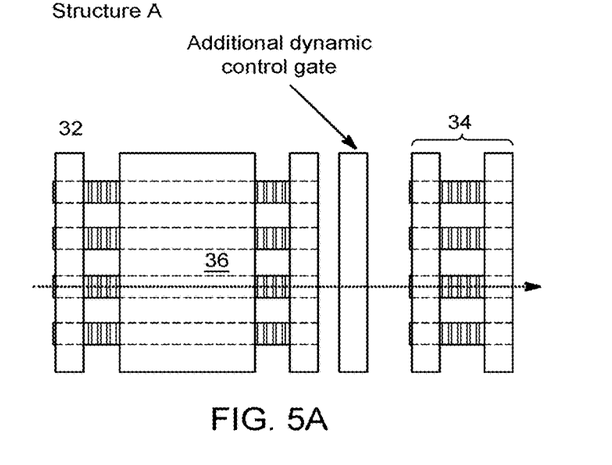
FIG. 5A is a schematic illustrating an LDMOS structure of the present invention utilizing a supplemental control gate in between a pseudo drain at one end of the Fin channel and a drain contact.
Figure 5B:
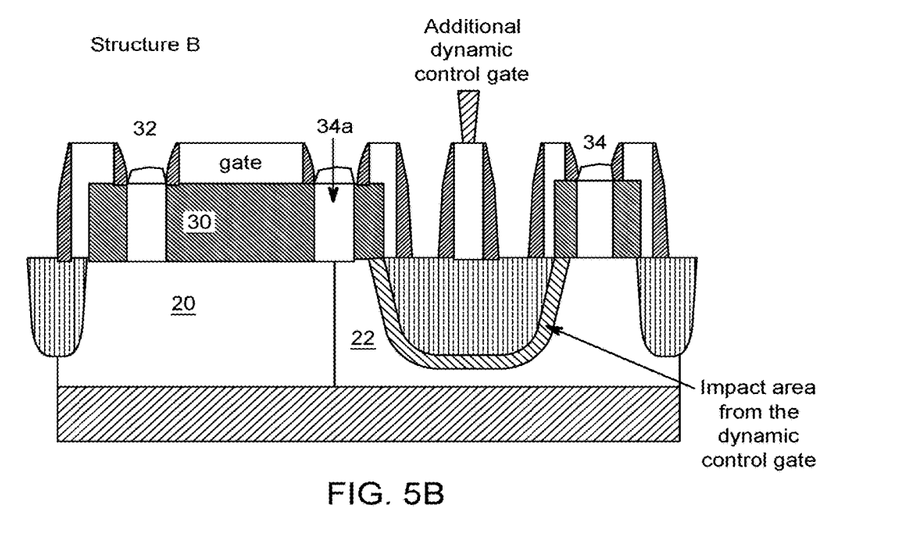
FIG. 5B is a schematic showing a cross section of the LDMOS structure shown in FIG. 5A.

FIG. 5A is a schematic illustrating an LDMOS structure of the present invention utilizing an additional control gate in between a pseudo drain 34a at one end of the Fin channel 30 and the drain contact 34. FIG. 5B is a schematic showing a cross section of the LDMOS structure shown in FIG. 5A. As in FIGS. 4A and 4B, supplemental gate 50 is provided on top of STI 12. As before, applying a voltage to supplemental gate 50 operates to bias the region of the STI around regions 44 and 46, serving to extend the operational conditions of the FinFET LDMOS. The pseudo drain configuration permits a larger area for current collection and can be advantageous during a turbo mode of operation which drive more current, where a lower resistance would be desirable. FIG. 5B shows a placement of the STT and control gate separated from the p-well by a separation distance designed to permit adequate current flow in the n-well without the flow path being severely constricted. In one embodiment, the separation distance ranges from 0.1 to 10 microns. In another embodiment, the separation distance can be between 0.5 and 5 microns. In another embodiment, the separation distance can be between 1 and 2 microns.

Figure 6:
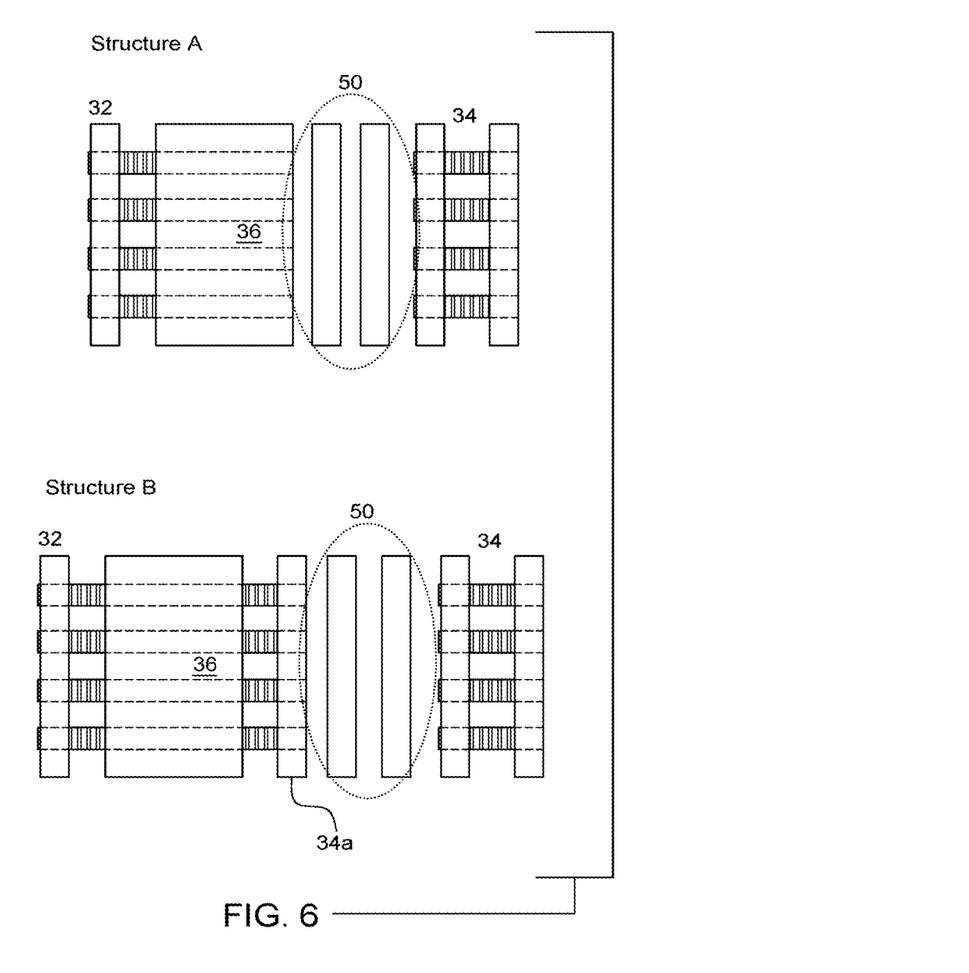
FIG. 6 is a schematic illustrating two other versions of the LDMOS structure of the present invention utilizing multiple supplemental control gates.

FIG. 6 is a schematic illustrating two additional LDMOS structures of the present invention both utilizing multiple supplemental control gates 50 in between one end of the Fin channel 30 (.e.g., at the pseudo drain 34) and the drain contact 34.

The inventive structures and control procedures described above provide for reliable FinFET LDMOS operation at the 16 nm and 7 nm gate width designs, important for the advance of this technology. Also, the dynamic control of the present invention can boost performance in turbo mode and would be utilized during calculation intensive impulses.

Fabrication Procedures

US Pat. Appl. Publ. No. 20130062692 (the entire contents of which are incorporated herein by reference) describes the manufacturing of a half-FinFET semiconductor device 100 implemented as a lateral diffused metal-oxide-semiconductor (LDMOS) device. The steps described in the '692 document are applicable for the building of the base components of the present invention prior to the addition of supplemental control gate(s) 50. U.S. Pat. No. 9,379,236 (the entire contents of which are incorporated herein by reference) describes a lateral double-diffused MOS (LDMOS) bulk finFET device for high-voltage operation. The steps described in the '236 patent are applicable for the building of the base and upper components of the present invention prior to the addition of supplemental control gate(s) 50. While similar steps can be used, below is a description of procedures for making the LDMOS structure of the present invention.

Figure 7A:
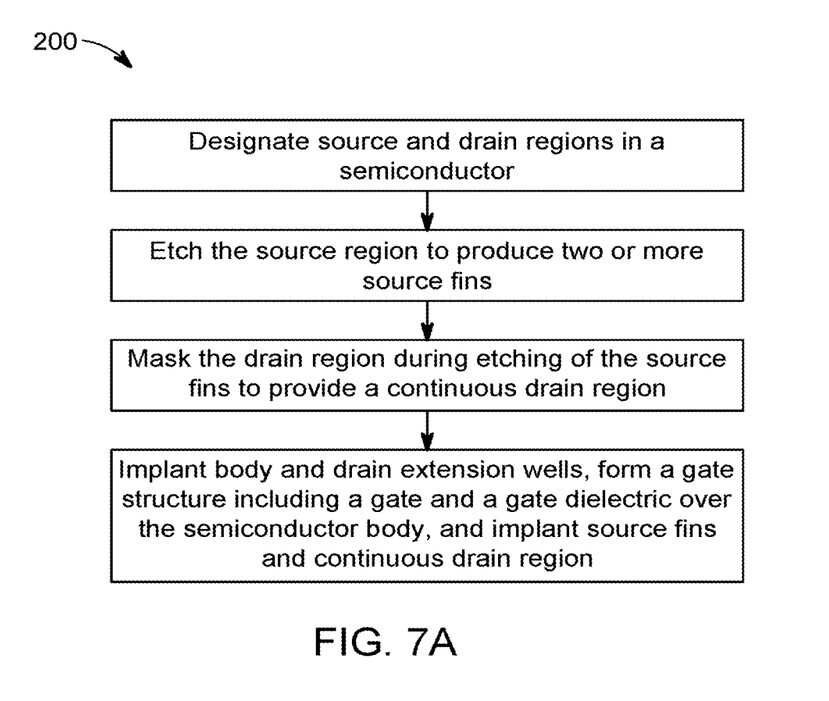
FIG. 7A is a flowchart presenting a method for fabricating the base components of the LDMOS structure of the present invention.
Figure 7B:
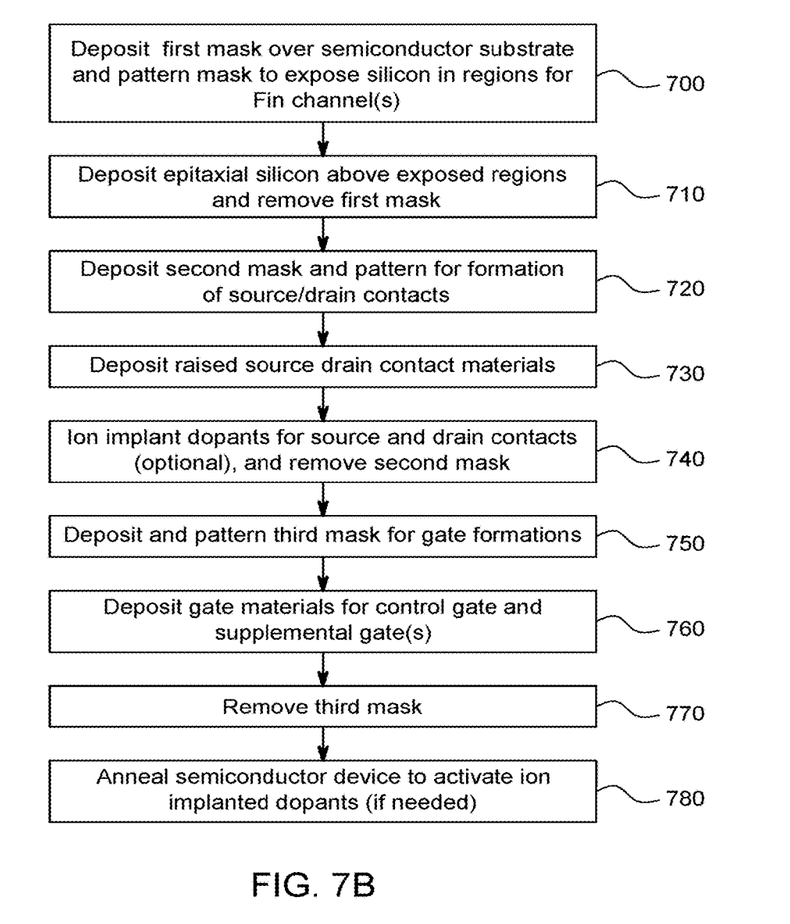
FIG. 7B is a flowchart presenting a method for fabricating the control components of the LDMOS structure of the present invention.

FIG. 7A is a flowchart presenting a method for fabricating the base components of the LDMOS structure of the present invention. FIG. 7B is a flowchart presenting a method for fabricating the control components of the LDMOS structure of the present invention.

Figure 8:
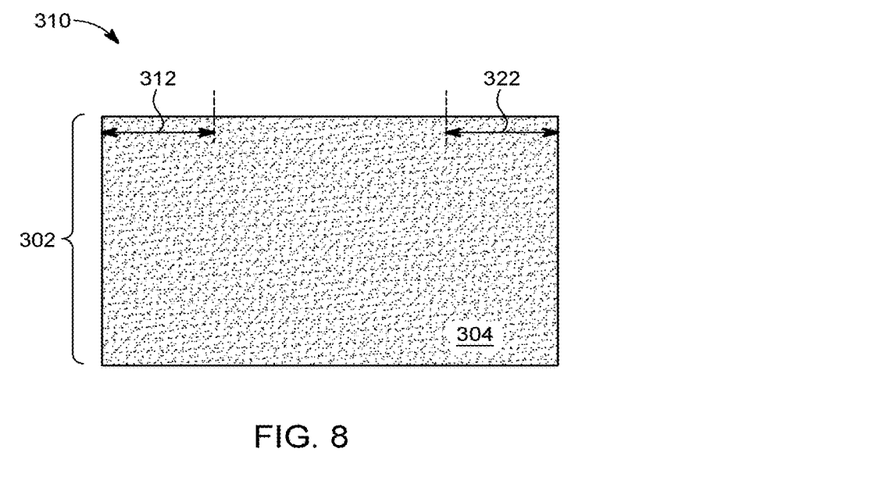
FIG. 8 is a schematic illustrating a cross-sectional view a semiconductor device substrate and early fabrication stage.

Referring to step 210 in FIG. 7A with additional reference to structure 310, shown in FIG. 8, step 210 of flowchart 200 comprises designating source and drain regions in semiconductor body 302. Step 210 corresponds to designating region 322 for formation of a source region and designating region 312 for formation of a drain region.

Figure 9:
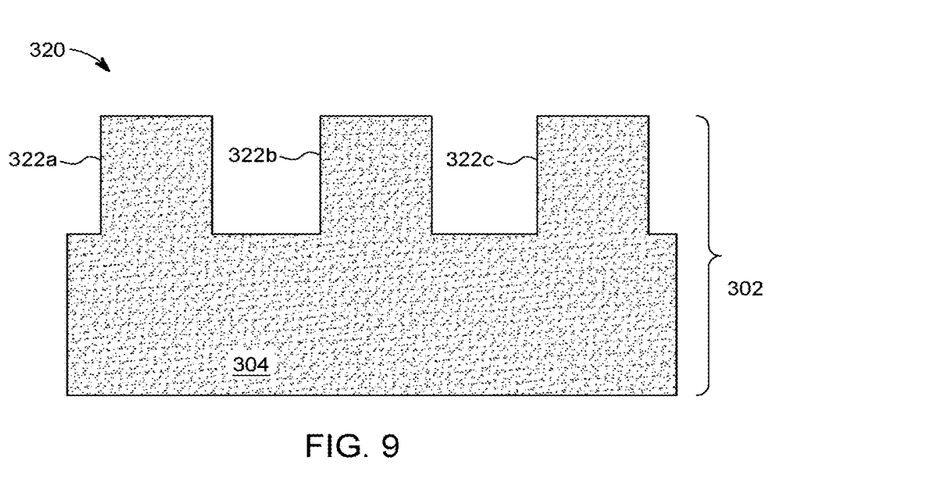
FIG. 9 is a schematic illustrating a cross-sectional view of a semiconductor device substrate at an intermediate fabrication stage.

Step 220 of flowchart 200 comprises etching the source region to produce source fins 322 $a$, 322 $b$, and 322 $c$ (hereinafter "source fins 322 $a$-322 $c$"). FIG. 9 presents a cross-sectional view of a FinFET structure 320, prior to formation of isolation regions (STIs) and implantation of the source region. Source fins 322 $a$-322 $c$ may be formed in semiconductor body 302 using a plasma etch, or other dry etch process, for example, as known in the art, and may comprise silicon fins. Source fins 322 $a$-322 $c$ may also formed by epitaxial growth of silicon vertically from the substrate 304.

Figure 10:
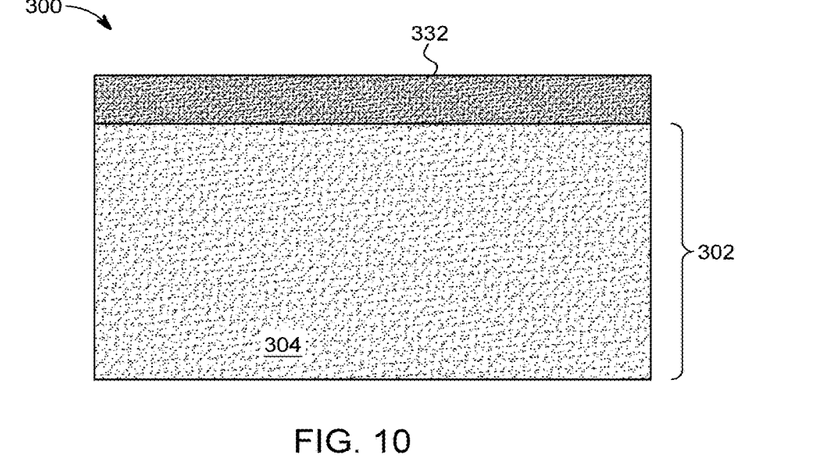
FIG. 10 is a schematic illustrating a cross-sectional view of a semiconductor device substrate at an intermediate fabrication stage.

Continuing with step 230, step 230 comprises masking the drain region during etching of source fins 322 $a$-322 $c$ to provide a continuous drain region. FIG. 10 presents a cross-sectional view of the FinFET structure prior to implantation of p-type body well 20 and n type drain well 22 (shown in FIG. 4B). Step 230 may be performed by forming mask 332 over drain region 312 designated in substrate 304. Mask 332 may take the form of a photoresist layer, for example, comprising a polymer matrix including styrene, acrylate, or methacrylate monomers, for instance. Mask 332 can be formed by any suitable deposition process, as known in the art.

It is emphasized that although steps 220 and 230 are described as distinct steps herein as a conceptual aid, in practice, the masking process utilized in step 230 is contemplated as being the same masking process used to enable formation of source fins 322 $a$-322 $c$, shown in FIG. 9. Thus, steps 220 and 230 of flowchart 200 may be executed substantially concurrently.

Figure 11:
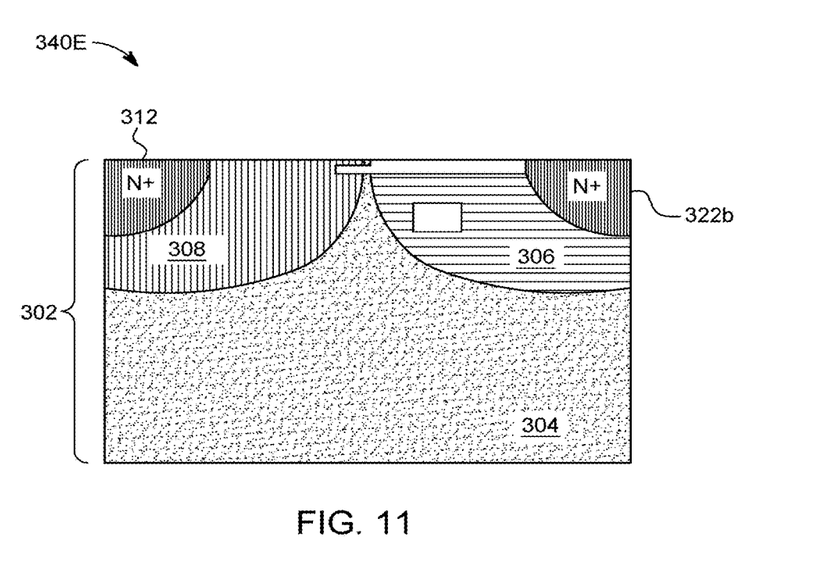
FIG. 11 is a schematic illustrating a cross-sectional view of the base components of the LDMOS FinFET device of the present invention.

Step 240 of flowchart 200 comprises implanting body well 306 and drain extension well 308, forming gate structure 342 including gate 344 and gate dielectric 346 between continuous drain region 312 and the source region including source fin 322 $b$, and implanting continuous drain region 312 and the source region including source fin 322 $b$. FIG. 11 presents a cross-sectional view of the base components of the FinFET structure.

Structure 340E, in FIG. 11, shows semiconductor body 302 comprised of substrate 304, P type body well 306 formed in or over substrate 304, and N type drain well 308 formed in or over substrate 304. In some embodiments, P type body well 306 and N type drain extension well 308 may be formed in an epitaxial semiconductor layer, such as a silicon or germanium epitaxial layer, formed on substrate 304.

Figure 12:
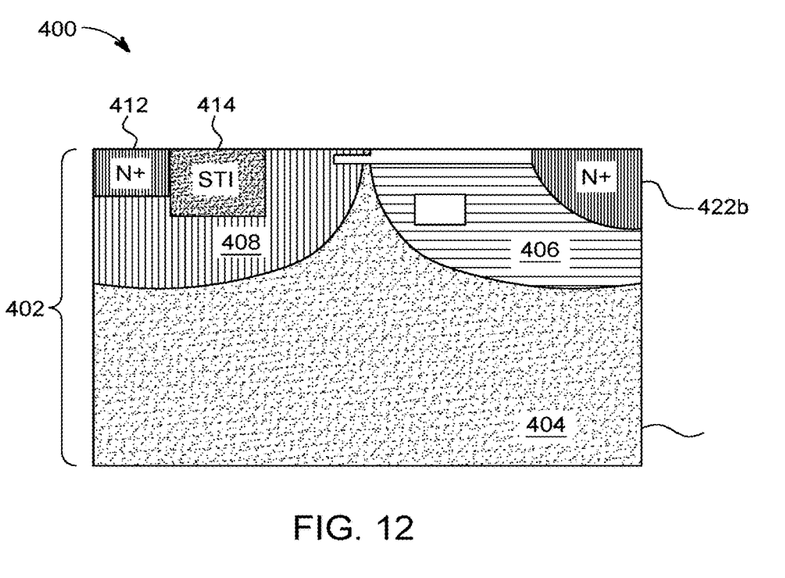
FIG. 12 is a schematic illustrating a cross-sectional view of preferred base components of the LDMOS FinFET device of the present invention.

Referring to FIG. 12, FIG. 12 shows a cross-sectional view of a FinFET semiconductor device 400, according to another embodiment of the present invention. The semiconductor device 400, in FIG. 12, comprises semiconductor body 402 including substrate 404, P type well region 406, N type drain extension well 408, source fin 422 $b$, continuous drain region 412 and channel region 450, corresponding to semiconductor body 302 including substrate 304, P type well region 306, N type drain extension well 308, source fin 322 $b$, continuous drain region 312 and channel region 350.

Also shown in FIG. 12 is isolation body 414 which is formed between continuous drain region 412 and gate structure 442. Isolation body 414 may comprise a shallow trench isolation (STI) structure, such as an STI structure formed of $SiO_2$, for example, and may be formed according to known CMOS fabrication process steps. U.S. Pat. No. 6,784,077 (the entire contents of which are incorporated herein by reference) describes a shallow trench isolation process fabrication process suitable for the present invention, but other known STI processes can be used. According to the embodiment shown in FIG. 4, isolation body 414 may be implemented to provide additional voltage breakdown resistance to structure 400.

Once the base components are fabricated, the upper Fin channel and gate control elements can be formed.

FIG. 7B depicts those steps. At 700, deposit/form a first mask over semiconductor substrate and pattern the first mask to expose silicon in regions of the substrate where the Fin channel(s) 30 are to be formed. At 710, deposit epitaxial silicon above the exposed regions and thereafter remove the first mask. At 720, deposit a second mask and pattern for formation of source and or drain contacts. At 730, deposit raised source drain contact materials to form source 32, drain 34, and/or pseudo-drain 34$a$. At 740, optionally ion implantation provides dopants for source and drain contacts if the raised source/drain contact materials were not doped (or provides dopant to adjust threshold voltage levels in the Fin channels) and thereafter remove second mask. At step 750, deposit and pattern third mask for gate formation. At step 760, deposit gate materials (see discussion below) for the control gate 36 and the supplemental gate(s) 50. At step 770, remove third mask. At step 780, optionally, anneal the fabricated semiconductor device to activate ion implanted dopants.

All of the above steps are not mandatory and may be performed in an order different from that enumerated on FIG. 7B.

As clear from the depictions shown by FIG. 4A, the channel region may include a plurality of fin regions formed above p-well 20 contiguous with respective source fins 30 (shown in FIGS. 4A and 4B) and extending under gate structure 36. Moreover, gate 36 in FIG. 4B may be implemented as a multi-gate structure, having multiple planar interfaces with the channel fins contiguous with source fins 30. U.S. Pat. No. 9,159,809 (the entire contents of which are incorporated herein by reference) describes a suitable steps for a multi-gate fabrication process applicable here. The '809 patent describes a multi-gate transistor device including a substrate, a fin structure extending along a first direction formed on the substrate, a gate structure extending along a second direction formed on the substrate, a drain region having a first conductivity type formed in the fin structure, a source region having a second conductivity type formed in the fin structure. The '809 patent utilized a gate structure covering a portion of the fin structure, and including a gate dielectric layer and a gate conductive layer covering a portion of sidewalls of the fin structure. The gate dielectric layer 22 in the '809 patent included conventional dielectric material such as silicon oxide (SiO), silicon nitride (SiN), or silicon oxynitride (SiON), as well as high-K dielectric material such as hafnium oxide (HfO), hafnium silicate (HfSiO), or metal oxide or metal silicate exemplarily of aluminum (Al), zirconium (Zr), lanthanum (La). The gate conductive layer in the 809 patent included a polysilicon layer or metal layer.

In fabricating gate 36 or supplemental gate 50 of the present invention, the gate material may include polysilicon, a silicide, one or more barrier layers, a metal, for example, and may be formed over a suitable gate dielectric 40, such as silicon oxide ($SiO_2$) or silicon nitride ($Si_3N_4$). Alternatively, gate 36 or supplemental gate 50 may comprise a gate metal and gate dielectric with the gate dielectric implemented as a high-K dielectric such as hafnium oxide ($HfO_2$), zirconium oxide ($ZrO_2$), or the like, using the appropriate known CMOS fabrication step(s). The gate metal may be formed of any gate metal suitable for use in an NMOS device, such as tantalum (Ta), tantalum nitride (TaN), titanium carbide (TiC) or titanium nitride (TiN), for example. Moreover, in embodiments in which the LDMOS is adapted so as to correspond to a p-channel device, gate 36 or supplemental gate 50 may be formed of any gate metal suitable for use in a PMOS device, such as molybdenum (Mo), ruthenium (Ru), titanium carbide (TiC) or titanium nitride (TiN), or tantalum carbide nitride (TaCN), for example.

Accordingly, the gate materials deposited can form supplemental gate 50 over the STT region 12, as shown in FIGS. 4A, 4B, 5A, and 5B. Alternatively, a plurality of supplemental gates 50 can formed over the STI region 12, as shown in FIG. 8.

Figure 13:
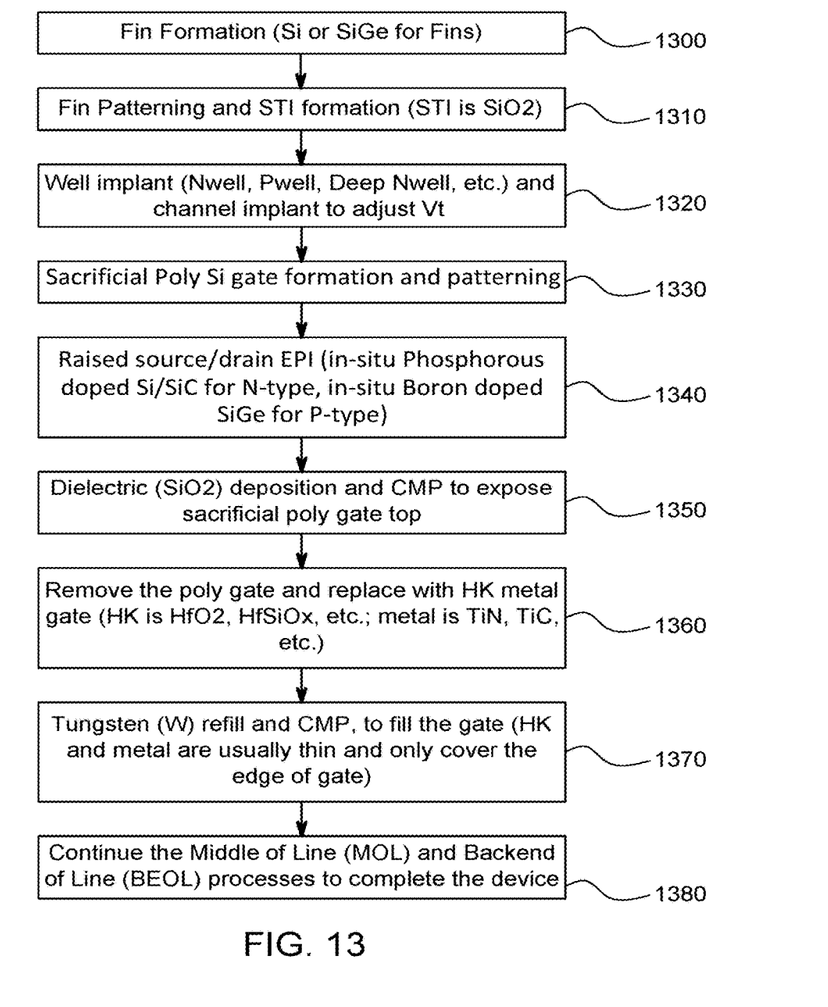
FIG. 13 is a schematic of a flowchart presenting another method for fabricating the control components of the LDMOS structure of the present invention.

In another embodiment of the invention, the following sequence of steps (illustrated in FIG. 13) can be used once the base components are fabricated. As shown in FIG. 13, at 1300, material for the Fin channels 30 (for example Si and/or SiGe) are formed on the base substrate. In one option, the Fin material is deposited by epitaxial growth in selected areas. In another option, as at 1310, epitaxial Si and/or SiGe growth occurs everywhere on the base substrate and selective patterning and removal of unwanted Si and/of SiGe material from areas where the Fin channel will not exist in the fabricated device. At 1310, the shallow trench isolations are also formed. At 1320, well implants (Nwell, Pwell, Deep Nwell, etc.) and channel implant occur to adjust threshold voltages Vt for the resultant FinMOSFET. At 1330, poly-crystalline silicon based gate materials are formed and patterned. At 1330, raised source/drain epitaxial growth occurs with in situ dopants (phosphorous doped Si/SiC for n-type, in-situ boron doped SiGe for p-type). U.S. Pat. No. 8,592,916 (the entire contents of which are incorporated herein by reference) describes a raised source drain fabrication process suitable for the present invention, but other known RSD processes can be used. The '916 patent describes that a lower raised source/drain region is formed on a planar source/drain region of a planar field effect transistor or a surface of a portion of semiconductor fin adjoining a channel region of a fin field effect transistor. In the '916 patent, at least one contact-level dielectric material layer was formed and planarized, and a contact via hole extending to the lower raised source/drain region was formed in the at least one contact-level dielectric material layer. In the '916 patent, an upper raised source/drain region was formed on a top surface of the lower raised source/drain region. In the '916 patent, a metal semiconductor alloy portion and a contact via structure were formed within the contact via hole. In the 916 patent, raised source/drain regions were formed by selectively depositing a semiconductor material on exposed source/drain regions and preferably not deposited on nearby dielectric surfaces. The deposited semiconductor material in the '916 patent, was for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material.

At 1340, a dielectric (e.g., $SiO_2$ or the other insulator) is deposited and chemical mechanical polishing (CMP) to exposes the top of polycrystalline silicon formed at 1330. At 1350, the polycrystalline silicon in the gate is removed and replaced with a high-K (HK) dielectric/metal gate (where for example HK is $HfO_2$, $HfSiO_x$, etc.; and the metal is TiN, TiC, etc.)

At 1360, a tungsten (W) refill and CMP process is used to fill and cover the gate (the HK and metal are usually thin and only cover the edge of gate). At 1380, Middle of Line (MOL) and Backend of Line (BEOL) processes complete the device.

Generalized Statements of the Invention

The following statements of the invention provide one or more characterizations of the present invention and do not limit the scope of the present invention.

Statement 1. A FinFET semiconductor device comprising: a semiconductor body including a source region of a first type, and a drain region of a second type, and a drain-region shallow trench isolation (STT) disposed in the drain region. The device includes a plurality of fins attached to the semiconductor body and extending across the semiconductor body; a channel gate structure disposed over a section of said plurality of fins; and a supplemental gate disposed on the drain-region STI.

Statement 2. The device of statement 1, wherein the plurality of fins comprises an undoped semiconductor material.

Statement 3. The device of statement 2, wherein the plurality of fins comprises undoped silicon, and the semiconductor body comprises at least doped silicon for the source region and the drain region.

Statement 4. The device of any of the statements above, wherein the drain-region STI extends to a depth of 60 nm.

Statement 5. The device of statement 4, wherein the supplemental gate, when biased, accumulates charge in a region of the semiconductor body proximate the drain-region STI.

Statement 6. The device of statement 4, wherein the supplemental gate, when biased, depletes charge from a region of the semiconductor body proximate the drain-region STI.

Statement 7. The device of any of the statements above, wherein the drain-region STI and the supplemental gate are offset from an end of the plurality of fins opposite the source region by 2-50 nm.

Statement 8. The device of any of the statements above, wherein the drain-region STI and the supplemental gate are offset from an end of the plurality of fins opposite the source region by 5-10 nm.

Statement 9. The device of any of the statements above, wherein an edge of the drain-region STI is aligned an end of the plurality of fins opposite the source region.

Statement 10. The device of statement 8, further comprising peripheral shallow trench isolations isolating the source and drain regions from device components outside of the peripheral shallow trench isolations.

Statement 11. The device of any of the statements above, wherein at least one of the source and drain regions comprises a raised contact.

Statement 12. The device of any of the statements above, wherein the drain region comprises a raised drain contact disposed an opposite side of the drain-region STI from the plurality of fins.

Statement 13. The device of any of the statements above, further comprising a pseudo drain contact disposed between the drain-region STI and the plurality of fins.

Statement 14. The device of any of the statements above, wherein the source region comprises an epitaxial doped region adjoining the plurality of fins.

Statement 15. The device of any of the statements above, wherein the supplemental gate comprises two supplemental control gates disposed on the drain-region STI.

Statement 16. The device of any of the statements above, wherein said semiconductor body, the plurality of fins, and the control gate comprise an n-channel metal-oxide-semiconductor (NMOS) device.

Statement 17. The device of any of the statements above, wherein said semiconductor body, the plurality of fins, and the control gate comprise a p-channel metal-oxide-semiconductor (NMOS) device.

Statement 18. The device of statement 1, wherein said semiconductor body, the plurality of fins, and the control gate comprise a depletion mode metal-oxide-semiconductor (MOS) device.

Statement 19. A method for operating a MOSFET transistor having a semiconductor body, a plurality of fins attached to the semiconductor body and extending across the semiconductor body; a channel gate disposed over a section of the fins, and a supplemental gate disposed on a drain-region STI, the method comprising: providing control voltages to the channel gate; and under higher power switching conditions, applying a supplemental voltage to the supplemental gate.

Statement 20. The method of statement 19, wherein the applying of the supplemental voltage at least one of depletes or accumulates charge carriers under the drain-region STI.

Numerous modifications and variations of the invention are possible in light of the above teachings. It is therefore to be understood that within the scope of the appended claims, the invention may be practiced otherwise than as specifically described herein.

The invention claimed is:

1. A FinFET semiconductor device comprising:
a semiconductor body including a source region of a first type, and a drain region of a second type, and a drain-region shallow trench isolation (STI) disposed in the drain region;
a plurality of fins attached to the semiconductor body and extending across the semiconductor body;
a channel gate structure disposed over a section of said plurality of fins;
a supplemental gate disposed on the drain-region STI.

2. The device of claim 1, wherein the plurality of fins comprises an undoped semiconductor material.

3. The device of claim 2, wherein the plurality of fins comprises undoped silicon, and the semiconductor body comprises at least doped silicon for the source region and the drain region.

4. The device of claim 1, wherein the drain-region STI extends to a depth of 60 nm.

5. The device of claim 4, wherein the supplemental gate, when biased, accumulates charge in a region of the semiconductor body proximate the drain-region STI.

6. The device of claim 4, wherein the supplemental gate, when biased, depletes charge from a region of the semiconductor body proximate the drain-region STI.

7. The device of claim 1, wherein the drain-region STI and the supplemental gate are offset from an end of the plurality of fins opposite the source region by 2-50 nm.

8. The device of claim 1, wherein the drain-region STI and the supplemental gate are offset from an end of the plurality of fins opposite the source region by 5-10 nm.

9. The device of claim 1, wherein an edge of the drain-region STI is aligned an end of the plurality of fins opposite the source region.

10. The device of claim 8, further comprising peripheral shallow trench isolations isolating the source and drain regions from device components outside of the peripheral shallow trench isolations.

11. The device of claim 1, wherein at least one of the source and drain regions comprises a raised contact.

12. The device of claim 1, wherein the drain region comprises a raised drain contact disposed an opposite side of the drain-region STI from the plurality of fins.

13. The device of claim 1, further comprising a pseudo drain contact disposed between the drain-region STI and the plurality of fins.

14. The device of claim 1, wherein the source region comprises an epitaxial doped region adjoining the plurality of fins.

15. The device of claim 1, wherein the supplemental gate comprises two supplemental control gates disposed on the drain-region STI.

16. The device of claim 1, wherein said semiconductor body, the plurality of fins, and the supplemental gate comprise an n-channel metal-oxide-semiconductor (NMOS) device.

17. The device of claim 1, wherein said semiconductor body, the plurality of fins, and the supplemental gate comprise a p-channel metal-oxide-semiconductor (PMOS) device.

18. The device of claim 1, wherein said semiconductor body, the plurality of fins, and the supplemental gate comprise a depletion mode metal-oxide-semiconductor (MOS) device.

\* \* \* \* \*